United States Patent [19]
Buller et al.

[11] Patent Number: 6,037,224
[45] Date of Patent: Mar. 14, 2000

[54] METHOD FOR GROWING DUAL OXIDE THICKNESS USING NITRIDED OXIDES FOR OXIDATION SUPPRESSION

[75] Inventors: James F. Buller; H. Jim Fulford, Jr., both of Austin, Tex.

[73] Assignee: Advanced Micro Devices, Inc., Sunnyvale, Calif.

[21] Appl. No.: 08/850,853

[22] Filed: May 2, 1997

[51] Int. Cl.⁷ ............................................. H01L 21/8247
[52] U.S. Cl. .......................... 438/258; 438/264; 438/769
[58] Field of Search ................................... 438/257–267, 438/981, 769, 770

[56] References Cited

U.S. PATENT DOCUMENTS

| | | |
|---|---|---|
| 4,352,117 | 9/1982 | Cuomo et al. . |
| 5,254,489 | 10/1993 | Nakata . |
| 5,296,411 | 3/1994 | Gardner et al. . |
| 5,316,981 | 5/1994 | Gardner et al. . |
| 5,330,920 | 7/1994 | Soleimani et al. . |
| 5,362,685 | 11/1994 | Gardner et al. . |
| 5,387,540 | 2/1995 | Poon et al. . |
| 5,498,577 | 3/1996 | Fulford, Jr. et al. . |
| 5,591,681 | 1/1997 | Wristers et al. . |
| 5,604,159 | 2/1997 | Cooper et al. . |
| 5,637,520 | 6/1997 | Cappelletti et al. ................... 438/258 |
| 5,672,521 | 9/1997 | Barsan et al. . |
| 5,683,925 | 11/1997 | Irani et al. . |
| 5,851,893 | 12/1998 | Gardner et al. . |
| 5,861,347 | 1/1999 | Maiti et al. ............................. 438/787 |

OTHER PUBLICATIONS

Yoshikawa et al., "An EPROM Cell Structure for EPLD's Compatible with Single Poly–Si Gate Process," IEEE Transactions on Electron Devices, vol. 37, No. 3, Mar. 1990, pp. 675–679.

Han et al., "RTP No–Nitridation of Ultrathin $SiO_2$ for Superior Device Reliability and Suppressed Boron Penetration in Advanced Dual–Gate CMOS Logic Application," Microelectronics Research Center, Department of Electrical Computer Engineering, The University of Texas at Austin, 5 pages, no date provided.

*Primary Examiner*—Richard Booth
*Attorney, Agent, or Firm*—Conley, Rose & Tayon, P.C.; Eric A. Stephenson

[57] ABSTRACT

A method for growing dual thickness oxide includes the step of forming a first oxide having a first thickness. A thin layer of the first oxide is transformed into an oxygen diffusion barrier, wherein the oxygen diffusion barrier interfaces at the silicon substrate. A portion of the oxide and oxygen diffusion barrier is removed to expose an area on the silicon substrates. Thereafter, a second oxide is formed on the exposed area of the silicon substrate surface wherein the second silicon dioxide has a second thickness different from the first thickness.

19 Claims, 5 Drawing Sheets

METHOD FOR GROWING DUAL OXIDE THICKNESS USING NITRIDED OXIDES FOR OXIDATION SUPPRESSION

BACKGROUND OF THE INVENTION

1. Field of the Invention

The present invention relates generally to the art of semiconductor manufacturing and, more particularly, to a method of forming devices with dual oxide thicknesses.

2. Description of the Relevant Art

Semiconductor devices employ insulating layers to electrically isolate device, components such as conductive gates, from an underlying substrate. The insulating layers can be formed from an oxide material in general and silicon dioxide in particular. Forming an oxide layer is one of a number of processing steps in manufacturing devices wherein the oxide layer formation step generally includes placing a silicon wafer in a process tool, such as a furnace or rapid thermal annealer, and subjecting the silicon wafer to an ambient atmosphere containing oxygen at an elevated temperature. The oxygen reacts with the silicon surface of the wafer to form a thin oxide layer of generally uniform thickness. Thereafter, the wafer with thin oxide layer formed thereon, is subjected to further processing steps including, for example, the formation of one or more polysilicon gates.

Many modern programmable devices including EEPROMs are defined by sophisticated structures having dual oxide thicknesses. FIG. 1, for example, shows a cross-sectional view of an EEPROM having a multi-thickness oxide 12 along with a program transistor 14, a buried control gate 16, a floating gate 18, a sense transistor 20, and a read transistor 22. The multi-thickness oxide 12 includes a first or gate oxide 26 and a second or tunnel oxide 24. Proper operation of the EEPROM requires the tunnel oxide 24 to be significantly thinner when compared to the thickness of the gate oxide 26 for the following reasons.

The EEPROM shown in FIG. 1 can be "erased" or "programmed" by injection or removal of electrons onto floating gate 18. In the erase mode, a high voltage is connected to both the buried control gate 16 and gate 28 of program transistor 14. Concurrently, a low voltage (ground for example) is applied to source 30 of program transistor 14. Thus biased, a strong electric field is induced across tunnel oxide 24 between floating gate 18 and drain 32 of program transistor 14. This strong electric field induces electrons to tunnel from drain 32 to floating gate 18 causing an accumulation of negative charge thereon. Since floating gate 18 also acts as a gate to sense transistor 20, the accumulation of negative charge raises the threshold voltage of the associated sense transistor 20 which, in turn, inhibits current flow therethrough during a subsequent "read" mode.

In the program mode the control gate 16 and the source 30 of program transistor 14 are revered biased while program transistor is on thereby creating a strong reverse electric field across tunnel oxide 24. This reverse bias removes electrons from floating gate 18 by a tunneling mechanism. The removal of the electrons lowers the threshold voltage of sense transistor 20 which, in turn, promotes current flow therethrough during a subsequent "read" mode.

To achieve electron tunneling through tunnel oxide 24 in the presence of a strong electric field it is imperative that tunnel oxide 24 have a relatively thin cross-sectional thickness when compared to the thickness of gate oxide 26. Typically, a high quality EEPROM can be manufactured with tunnel oxide 24 having a thickness of 80–100 angstroms.

Prior art techniques for forming tunnel and gate oxides require multiple steps. The prior art technique will now be described with reference to FIGS. 2 through 9 which show a magnified view of region A in FIG. 1 after successive steps. More particularly, FIG. 2 shows silicon wafer 50 with a thin layer of oxide 26 formed thereon. The oxide is formed by reacting the silicon wafer 50 surface with an ambient atmosphere containing oxygen. This layer is used to form the gate oxide 26.

Thereafter, a layer of light sensitive photoresist 54 is deposited on the oxide 26 as shown in FIG. 3. The photoresist is selectively exposed to light transmitted through a photomask plate (not shown) having opaque and light transmissive areas. Light exposed regions of the photoresist are developed by subjecting the wafer to a washing technique which removes the exposed photoresist. FIG. 4 shows the result of the exposing and developing steps to create a window 56 through photoresist 54 to expose oxide 26.

The wafer is then subjected to an etching technique which removes oxide exposed by window 56 as shown in FIG. 5. This removal of the oxide provides an area on the silicon surface where tunnel oxide 24 can be grown. Before the tunnel oxide 24 can be formed, the photoresist material 54 must be removed because photoresist is formed of a carbon based material, and if the photoresist material is not removed prior to the tunnel oxide formation step, the photoresist will react in the high temperature oxygen environment needed to form the tunnel oxide, and inadvertently diffuse into the silicon window area which in turn precludes any formation of tunnel oxide thereon.

The photoresist removal technique, sometimes does not remove all of the photoresist material. It has been shown the removal technique may inadvertently leave behind bits and pieces of the photoresist on the surface of the silicon dioxide 52. FIG. 6 shows examples of residual photoresist particles remaining on the surface of silicon dioxide 52 after photoresist removal.

After removal of photoresist 54 the wafer is subjected to a second oxidation process to form the tunnel oxide on the exposed area. In this step like the step for forming the gate oxide, the wafer is subjected to an ambient of oxygen at elevated temperatures. However, oxygen diffuses through the gate oxide and reacts with the silicon thereunder thereby further growing the gate oxide. FIG. 7 shows the results of the formation of the tunnel oxide 24 and the further growth of gate oxide 26. However, as can be seen in FIG. 7 the resulting thickness of the gate oxide 26 is non-uniform due to the presence of the photoresist particles inadvertently remaining after photoresist removal. These particles inhibit further growth of the first oxide layer underneath the particles during formation of the tunnel oxide since oxygen penetratration is impeded by the photoresist and cannot react with the underlying surface of the silicon wafer.

FIGS. 8 and 9 show the results of depositing and selectively etching to form floating gate 18 and gate 28 of program transistor 14.

Several problems exist with EEPROMs having dual oxide thicknesses formed using the above described conventional techniques. These problems relate to manufacturability and reliability. With respect to manufacturability, the two oxidation steps needed to form the gate and tunnel oxides, increases the error deviation with respect to gate oxide thickness. The gate oxide is initially formed with a thickness less than what is ultimately required with the view of increasing the thickness during formation of the tunnel oxide. For example, in FIG. 2, the gate oxide thickness is grown with a thickness of, for example, 125 angstroms. The ultimate gate oxide thickness may be, for example, 150 angstroms. However, because the gate oxide also grows during the tunnel oxide formation step, it is necessary to initially make the gate oxide less than the required thickness. Because there are two separate oxidation steps which are implemented to form the gate oxide, there are two deviation errors associated therewith. In other words, there is a first error deviation associated with the growth of the initial 125 angstrom thick gate oxide and there is an additional standard deviation associated with the growth of the additional 25. These two standard deviations unduly increase the ultimate standard deviation associated with the gate oxide.

A further, more severe problem relates to device reliability. As can be seen in FIG. 9, gate 28 extends into gate oxide due to the gaps created step by the residual photoresist particles. In operation, gate 28 is subjected to high voltages during the "programming" and "erasing" of EEPROM 10. These voltages produce an electric field across gate oxide 26 which is directly proportional to the inverse of thickness of the underlying gate oxide. During the "programming" and "erasing" modes of EEPROM operation, gate oxide 26 is subjected to an unanticipated high electric field at areas of reduced thickness (i.e., the gaps created due to the residual photoresist). These high electric fields may cause the oxide to break down or rupture which in turn may render program transistor 14 inoperable.

SUMMARY OF THE INVENTION

The problems outlined above are in large part solved by the present invention of employing a thin nitrided oxide layer to suppress further growth of the gate oxide during formation of the tunnel oxide. In accordance with of the present invention, a first or gate oxide is formed on a silicon wafer by exposing the silicon wafer to an oxygen ambient. The wafer is then subjected to a nitrogen based atmosphere. During this step, nitrogen based material diffuses through the first oxide layer and interacts with the silicon dioxide at the silicon interface to form a thin layer of nitrided oxide. This oxynitride layer inhibits further growth in the first oxide layer during subsequent processing steps. Thereafter, a portion of the first oxide/oxynitride is selectively removed to expose an area on the silicon wafer surface where a second or tunnel oxide can be grown. The second oxide layer is formed by placing the wafer in an ambient of oxygen. The exposed area reacts with the oxygen thereby forming the second oxide. However, during this second oxidation step, the oxynitrided material acts as a oxygen diffusion barrier. Since the oxynitride layer is located at an interface between the first oxide and the silicon wafer, growth of the first oxide is inhibited during formation of the second oxide.

One advantage of the present invention is that it produces semiconductor devices having more consistent geometries.

Another advantage of the present invention is that it reduces the standard deviation of error with respect to the gate oxide thicknesses.

Yet another advantage of the present invention is that it reduces non-uniformities in gate oxide thicknesses.

Still another advantage of the present invention is that it reduces the occurrence of electrical shorts through the gate oxide.

BRIEF DESCRIPTION OF THE DRAWINGS

Other objects and advantages of the invention will become apparent upon reading the following detailed description and upon reference to the accompanying drawings in which.

Figure 1:
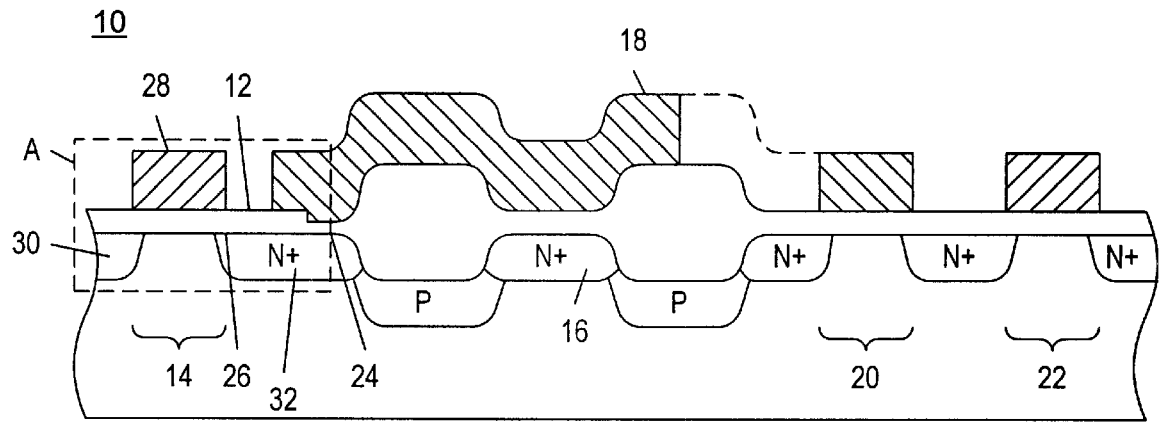
FIG. 1 is a cross-sectional view of a prior art EEPROM.
Figure 2:
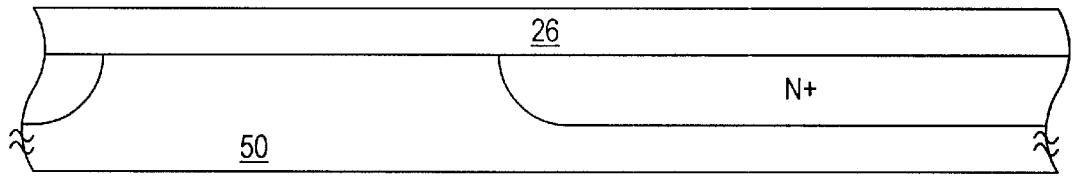
FIG. 2 is a cross-sectional view of a wafer having an oxide layer formed thereon.

While the invention is susceptible to various modifications and alternative forms, a specific embodiment thereof is shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

The present invention is described in connection with FIGS. 10–18 which show cross-sectional views of a silicon wafer after successive process steps to form the gate and tunnel oxides 26, 24 along with program transistor gate 28, and a portion of the floating gate 18 of an EEPROM such as shown in region A of FIG. 1. It is to be understood, however, that the present invention is useful in the manufacture of other semiconductor devices employing multi-thickness oxides.

Figure 10:
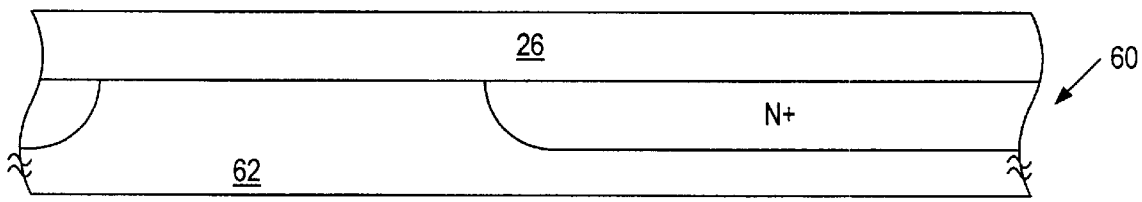
FIG. 10 is a cross-sectional view of a wafer having an oxide layer formed thereon.
Figure 11:
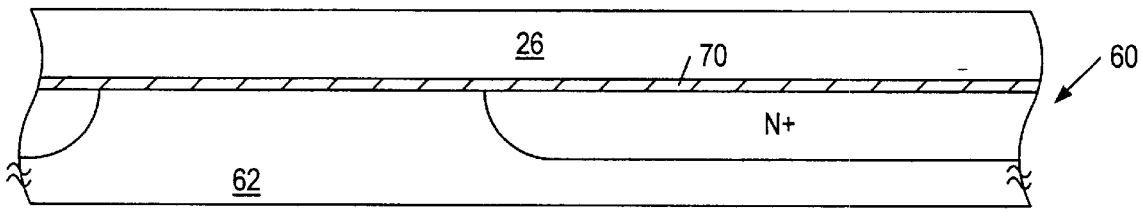
FIG. 11 is a cross-sectional view of a wafer having oxynitride and oxide layers formed thereon.

FIG. 10 is a cross-sectional view of the silicon wafer 60 with a first or gate oxide 26 formed thereon. FIG. 11 depicts an oxygen diffusion barrier or oxynitride layer 70 positioned at an interface of substrate 62 and gate oxide 26. The oxynitride layer is formed in situ with the formation of the gate oxide 26. Specifically, gate oxide 26 is formed by subjecting wafer 60 to an oxygenated atmosphere within a furnace or other similar process tool. The oxygen reacts with the silicon to form an oxide. Once the desired thickness of the gate oxide is formed, the oxygen is evacuated from the furnace and replaced with a nitrogen based material such as NO (nitric oxide). NO diffuses through the gate oxide 26 where it interacts with the silicon substrate to transform a very thin layer of the oxide into the oxynitride layer 70. It is to be understood that the oxynitride layer can be formed by diffusing nitrogen based materials other than NO.

Figure 3:
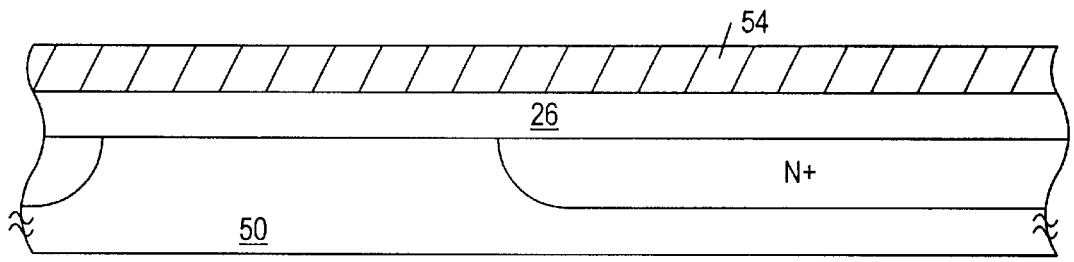
FIG. 3 is a cross-sectional view of a wafer having photoresist and oxide layers formed thereon in accordance with the prior art.
Figure 4:
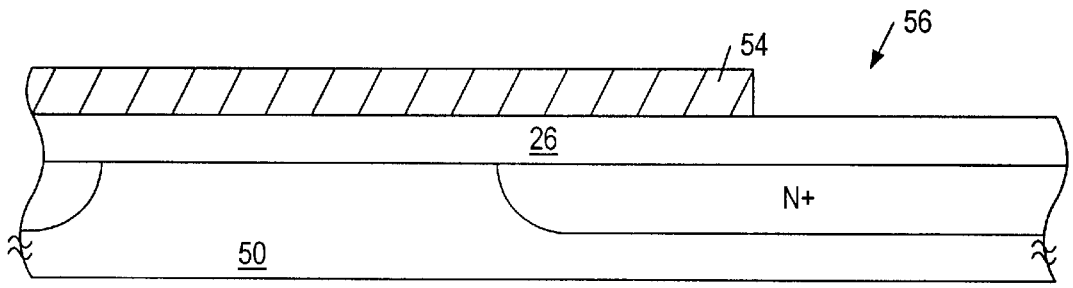
FIG. 4 is a cross-sectional view of a wafer having oxide and etched photoresist layers formed thereon in accordance with the prior art.
Figure 5:
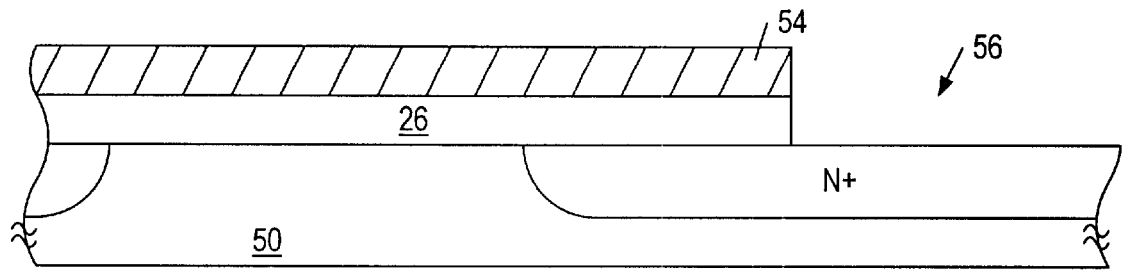
FIG. 5 is a cross-sectional view of a wafer having etched photoresist and oxide layers formed thereon in accordance with the prior art.
Figure 6:
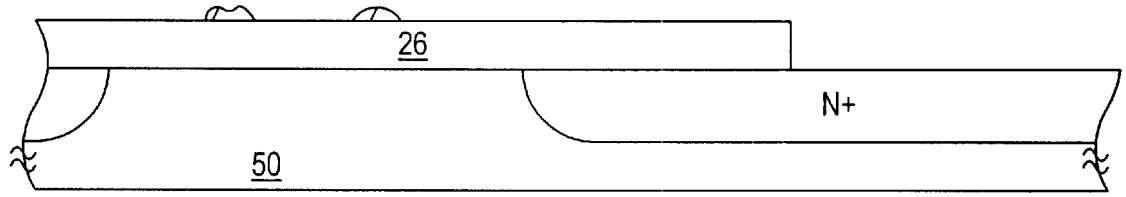
FIG. 6 is a cross-sectional view of a wafer having an etched oxide layer formed thereon in accordance with the prior art.
Figure 7:
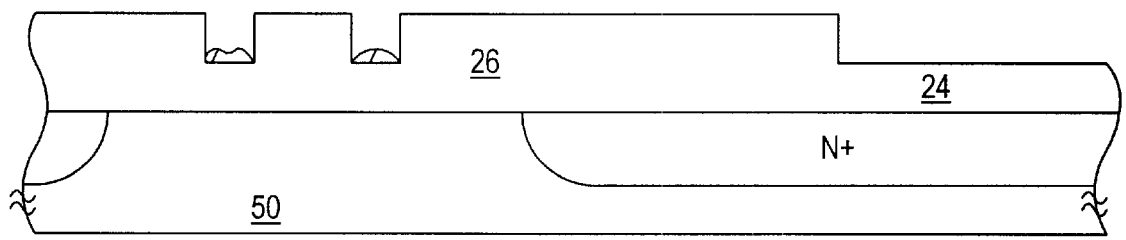
FIG. 7 is a cross-sectional view of a wafer having a dual thickness oxide layer formed thereon in accordance with the prior art.
Figure 8:
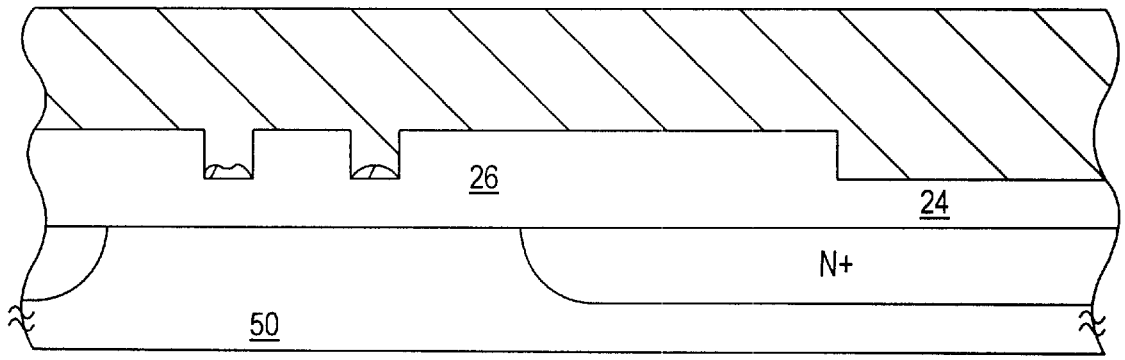
FIG. 8 is a cross-sectional view of wafer having a polysilicon and dual thickness oxide layers formed thereon in accordance with the prior art.
Figure 9:
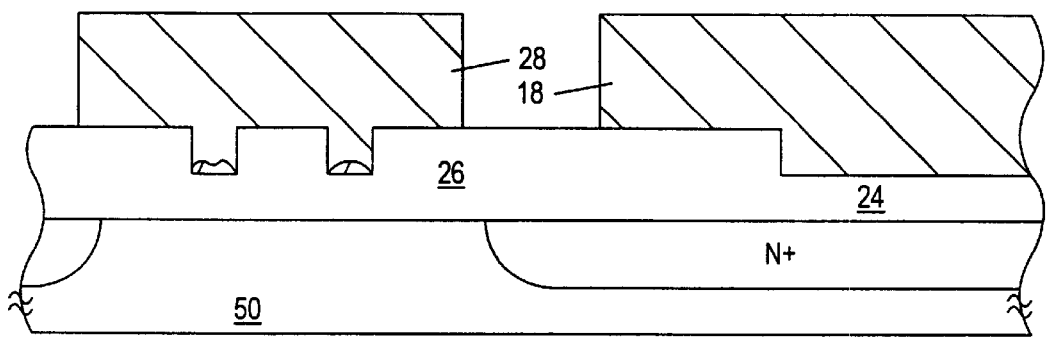
FIG. 9 is a cross-sectional view of a wafer having etched polysilicon and dual thickness oxide formed thereon in accordance with the prior art.
Figure 12:
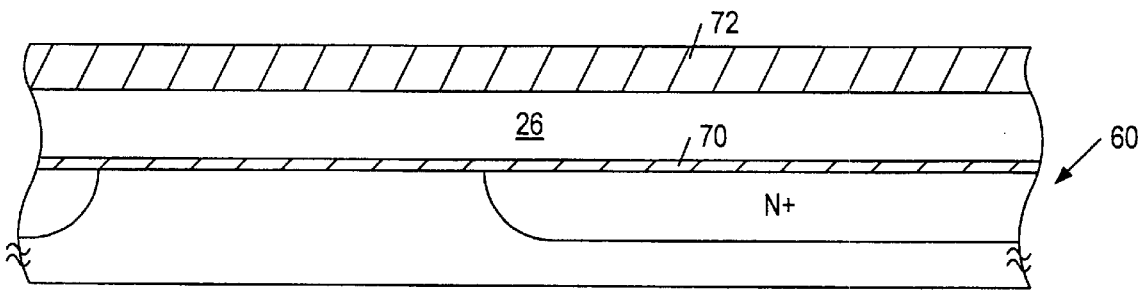
FIG. 12 is a cross-sectional view of a wafer having photoresist oxide and oxynitride layers formed thereon.
Figure 13:
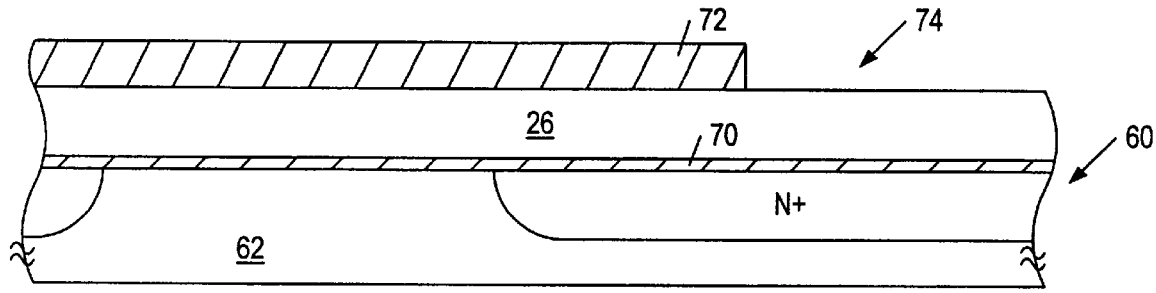
FIG. 13 is a cross-sectional view of a wafer having oxide oxynitride, etched photoresist layers formed thereon.

FIG. 12 shows a cross-sectional view of the wafer just after coating of a photoresist layer 72. FIG. 13 shows a window 74 formed through the photoresist layer after selective exposure of the wafer in FIG. 12 to light and subsequent development using a washing technique which removes exposed photoresist. The layers shown in FIGS. 12 and 13 may be formed using the same techniques used to form the layers shown in FIGS. 3 and 4 repeatedly.

Figure 14:
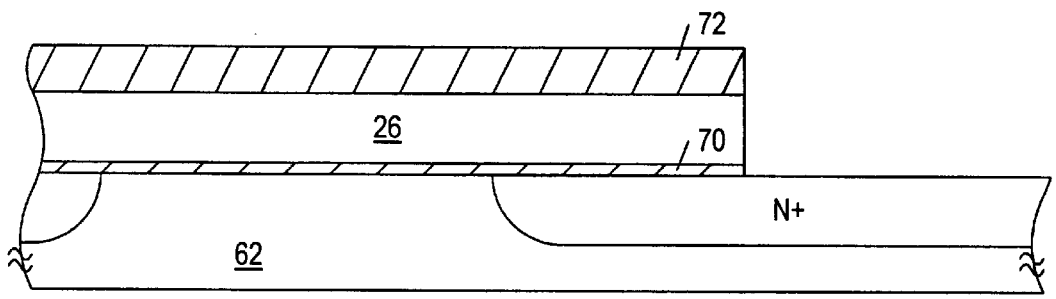
FIG. 14 is a cross-sectional view of a wafer having etched photoresist, oxide, and oxynitride layers formed thereon.
Figure 15:
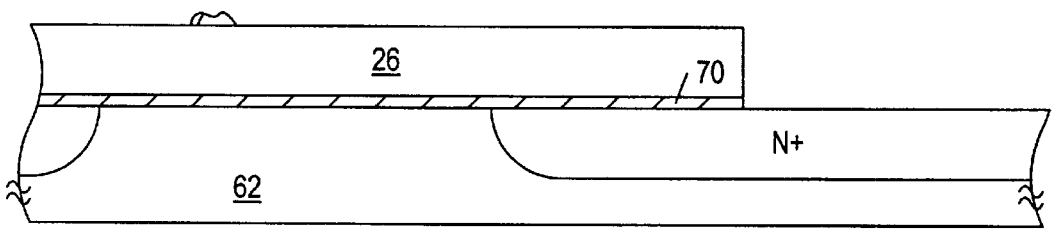
FIG. 15 is a cross-sectional view of a wafer having etched oxide and oxynitride layers formed thereon.

FIGS. 14 and 15 show a cross-sectional view of the silicon wafer after a portion of the gate oxide 26 and oxynitride layer 70 aligned with window 74 have been etched back, and the photoresist layer removed. As can be seen in FIGS. 14 and 15 the etched back region exposes a surface portion of the silicon substrate 62.

Figure 16:
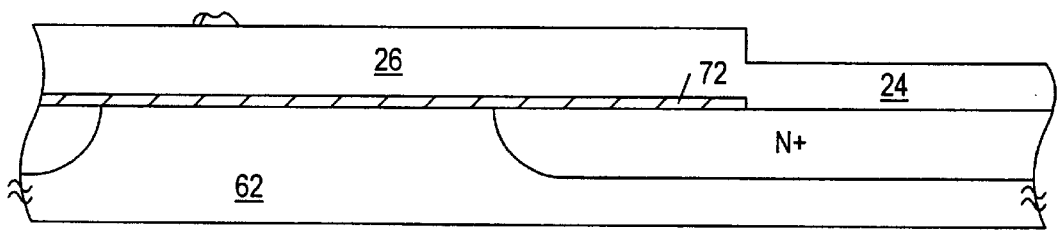
FIG. 16 is a cross-sectional view of a wafer having dual thickness oxide and etched oxynitride layers and etched oxynitride layers formed thereon.

The wafer is then subjected to a second oxidation process whereby the wafer is placed in a high temperature oxygen atmosphere which causes the formation of tunnel oxide 24 as shown in FIG. 16. Because of the oxygen suppression barrier or oxynitride layer 72, further growth of the gate oxide 26 is inhibited since oxygen cannot diffuse through the oxynitride layer 72 and react with the underlying silicon substrate 62. Accordingly, the gate oxide maintains its pre-tunnel oxide formation thickness.

Figure 17:
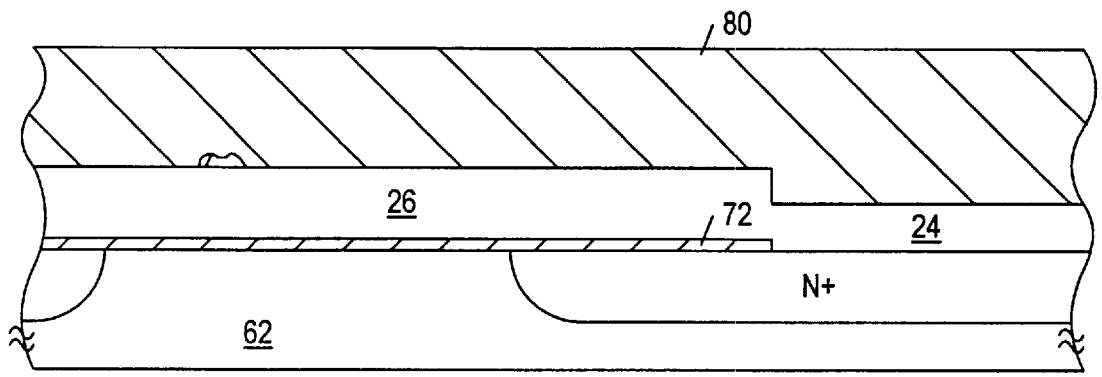
FIG. 17 is a cross-sectional view of a wafer having polysilicon, dual thickness oxide and etched oxynitride layers formed thereon.
Figure 18:
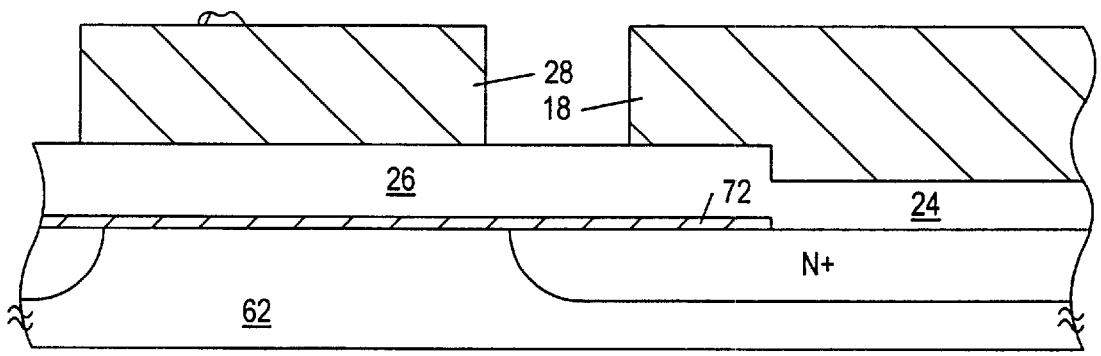
FIG. 18 is a cross-sectional view of a wafer having dual thickness oxide, etched oxynitride and etched polysilicon layers formed thereon.

FIGS. 17 and 18 show cross-sectional views of the program transistor gate 28 and a portion of floating gate after deposition and selective removal of polysilicon layer 80. As can be seen, using the method of the present invention, the gate oxide 26 has a uniform thickness despite the presence of residual photoresist particles. Uniformity in gate oxide thickness reduces the risk of gate oxide rupture when gate 28 is subjected to high voltage during the program and erase modes of the EEPROM. The uniformity also enhances standard deviation of gate oxide thickness.

It will be appreciated to those skilled in the art having the benefit of this disclosure that this invention is believed to be capable of forming dual oxide thicknesses with a reduction in the standard deviation of error in gate oxide thickness and which has uniform thickness. Numerous variations and modifications will become apparent to those skilled in the art once the above disclosure is fully appreciated. It is intended that the following claims be interpreted to embrace all such modifications and changes.

What is claimed is:

1. A method of forming dual thickness silicon dioxide on a silicon substrate, the method comprising the steps:

forming a first silicon dioxide on the silicon substrate, where the first silicon dioxide has a first thickness;

transforming a sublayer of the first silicon dioxide into an oxygen diffusion barrier, wherein the oxygen diffusion barrier interfaces the silicon substrate;

selectively removing aligned portions of the first silicon dioxide and oxygen diffusion barrier to expose a surface area on silicon substrate;

forming a second silicon dioxide on the exposed surface area of the silicon substrate, where the second silicon dioxide has a second thickness different than the first thickness;

wherein the first silicon dioxide engages the second silicon dioxide.

2. The method of claim 1 wherein the oxygen diffusion barrier is comprised of an oxynitride material.

3. The method of claim 1 wherein forming the oxygen diffusion barrier includes applying a nitrogen based material to the first silicon dioxide.

4. The method of claim 3 wherein the nitrogen based material is nitric oxide.

5. The method of claim 1 wherein the second thickness is greater than the first thickness.

6. The method of claim 1 wherein the first thickness is greater than the second thickness.

7. A method of forming dual thickness oxide on a silicon substrate, the method comprising the steps:

forming a first oxide on the silicon substrate, where the first oxide has a first thickness;

transforming a sublayer of the first oxide into an oxygen diffusion barrier, wherein the oxygen diffusion barrier interfaces the silicon substrate;

selectively removing aligned portions of the first oxide and oxygen diffusion barrier to expose a surface area on silicon substrate;

forming a second oxide on the exposed surface area of the silicon substrate, where the second oxide has a second thickness different than the first thickness;

wherein the first silicon dioxide engages the second silicon dioxide.

8. The method of claim 7 wherein the oxygen diffusion barrier is comprised of an oxynitride material.

9. The method of claim 7 wherein forming the oxygen diffusion barrier includes applying a nitrogen based material to the first oxide.

10. The method of claim 9 wherein the nitrogen based material is nitric oxide.

11. The method of claim 7 wherein the second thickness is greater than the first thickness.

12. The method of claim 7 wherein the first thickness is greater than the second thickness.

13. A method of forming a programmable memory device comprising the steps:

forming a first oxide on a surface of a silicon substrate, where the first oxide has a first thickness;

transforming a sublayer of the first oxide into an oxygen diffusion barrier, wherein the oxygen diffusion barrier is interfaced with the silicon substrate;

selectively removing aligned portions of the first oxide and oxygen diffusion barrier thereby exposing a surface area of the silicon substrate;

forming a second oxide on the exposed surface area of the silicon substrate surface where the second oxide has a second thickness different than the first thickness, wherein the first silicon dioxide engages the second silicon dioxide;

forming a floating gate for storing an electrical charge, the floating gate being formed over the second oxide;

forming logic devices on the silicon substrate for controlling electrical charge stored on the floating gate.

14. The method of claim 13 wherein forming the oxygen diffusion barrier includes reacting a nitrogen based material with first oxide.

15. The method of claim 14 wherein the nitrogen based material is nitric oxide.

16. The method of claim 13 wherein the oxygen diffusion barrier inhibits growth of the first oxide during formation of the second oxide.

17. The method of claim 13 wherein the second thickness is greater than the first thickness.

18. The method of claim 13 wherein the first thickness is greater than the second thickness.

19. The method of claim 13 wherein the first oxide is adjacent to the second oxide.

* * * * *

UNITED STATES PATENT AND TRADEMARK OFFICE
CERTIFICATE OF CORRECTION

PATENT NO. : 6,037,224
DATED : March 14, 2000
INVENTOR(S) : James F. Buller, et al.

It is certified that error appears in the above-identified patent and that said Letters Patent is hereby corrected as shown below:

On the title page, item [54] and column 1 line 2, delete "THICKNESS" and substitute --THICKNESSES--.

Signed and Sealed this

Thirteenth Day of February, 2001

Attest:

NICHOLAS P. GODICI

Attesting Officer        Acting Director of the United States Patent and Trademark Office